United States Patent [19]

Sternglass

[11] Patent Number: 4,964,011

[45] Date of Patent: Oct. 16, 1990

[54] VOLTAGE TRANSIENT PROTECTION CIRCUIT

[75] Inventor: Daniel Sternglass, Ithaca, N.Y.

[73] Assignee: Databook, Inc., Ithaca, N.Y.

[21] Appl. No.: 354,753

[22] Filed: May 22, 1989

[51] Int. Cl.$^5$ .............................................. H22H 3/18
[52] U.S. Cl. ....................................... 361/88; 307/66; 365/229
[58] Field of Search ..................... 361/86, 88; 307/64, 307/66, 120; 365/228, 229

[56] References Cited

U.S. PATENT DOCUMENTS

| | | | |
|---|---|---|---|
| 4,587,640 | 5/1986 | Scitoh | ................................. 365/229 |
| 4,750,040 | 6/1988 | Hakamada | .................... 365/229 X |

OTHER PUBLICATIONS

Specifications Of The SRAM IC Memory Card; Epson America, Inc. 8K-512 Bytes; Mar., 1987, Revised Jan. 1988.

Mitsubishi HR MELCARD, Spec. Sheet for Static Ram Cards, MF3128, MF 3256 and MF3512, Copyright 1987.

Primary Examiner—Derek S. Jennings

[57] ABSTRACT

A voltage transient protection circuit is provided for protecting a memory device such as a solid state memory cartridge from an undesired control signal which may occur during voltage transients in the primary supply voltage for such memory device. A transient detector detects transients occurring in the primary supply voltage. An isolation circuit is provided in the control bus, such isolation circuit being activated when a transient in the primary supply voltage is detected. A secondary voltage source supplies voltage to the transient detector and the isolation circuit sufficiently long while the primary voltage is fluctuating during a transient to permit the isolation circuit to isolate the control signal(s)el from said memory device.

4 Claims, 3 Drawing Sheets

VOLTAGE TRANSIENT PROTECTION CIRCUIT

BACKGROUND OF THE INVENTION

This invention relates in general to solid state memory devices and, more particularly, to an apparatus for protecting such devices from undesired voltage transients.

BRIEF SUMMARY OF THE INVENTION

Solid state memory cartridges, also referred to as random access memory (RAM) cartridges, are known to be a reliable and durable data storage media. One type of solid state memory cartridge is shown in FIG. 1 as including a card-like main body 10, one end of which contains a plurality of connecting pins 15 on which address, data and control signals are communicated. Other non-pin contact types of solid state memory cartridges are also available. Solid state memory cartridges may be plugged into a memory cartridge receiving apparatus. The connecting pins 15 of memory cartridge 10 are inserted in a connector within the memory cartridge receiving apparatus to couple the cartridge to associated electronic circuitry which provides for the writing of data to the cartridge, the reading of data from the cartridge and control of the operation of the cartridge. A desirable characteristic of memory cartridge 10 is that it is removable, that is, it can be removed from the aforementioned connector and be replaced by another memory cartridge.

Generally, memory cartridge 10 is coupled to a host computer or processor 20 which provides address, data and control signals to memory cartridge 10 as shown in FIG. 2. More specifically, in the example of FIG. 2, processor 20 is coupled via CARD ENABLE line 25, WRITE ENABLE line 30, OUTPUT ENABLE line 35 and address/data bus 55 to memory cartridge 10. Each of lines 25, 30 and 35 has a respective buffer 40 therein which is capable of isolating memory cartridge 10 from processor 20 and the processor's CARD ENABLE, WRITE ENABLE and OUTPUT ENABLE control signals. These lines 25, 30 and 35 are control lines.

Additionally, bus 55 has a buffer 50 therein which is also capable of isolating memory cartridge 10 from processor 20 and the processor's address and data signals. A cartridge connector (not shown) situated within the cartridge receiving apparatus is used to electrically and mechanically couple cartridge 10 to buffers 40 and 50.

Unfortunately, in the event of a voltage transient or a voltage anomaly on the main voltage supply to solid state memory cartridge 10 while the CARD ENABLE, WRITE ENABLE or OUTPUT ENABLE lines were active, the data in cartridge 10 could be corrupted by unintended writes. That is, during such an occurrence memory cartridge 10 would remain enabled and spurious data could be written to the cartridge at unpredictable memory locations within the cartridge. Such voltage transients or anomalies can occur during the initial power up sequence of the host computer or at other times due to power supply and power source fluctuations.

Typically, to protect memory cartridge 10 from physical damage as well as to protect the data stored therein during a normal power up sequence, the buffers 40 and 50 which couple processor 20 to memory cartridge 10 are placed in a high impedance state or are otherwise disabled for a predetermined time delay. In this manner, cartridge 10 is isolated while the main power supply voltage is allowed to stabilize. If, however, the voltage takes longer to stabilize than is allowed for by a predetermined delay or during voltage fluctuations that are not related to the power up sequence, the solid state memory cartridge may be unprotected from data corruption by undesired writes to the memory cartridge. That is, during the interval when the supply voltage is stabilizing after initial power up or at the onset of a voltage transient, the possibility exists of writing spurious data to unpredictable memory locations in the solid state memory cartridge.

Many mass storage devices, such as floppy disk drives for example, are equipped with a "power good" logic signal which indicates the state of the main power supply. When a voltage anomaly, as for example a low voltage transient is sensed on the main power line, the "power good" signal changes logic states and thereby signals the floppy disk drive that an anomalous voltage condition has been detected on the main power supply line. Such a "power good" signal senses a transient voltage condition fast enough to allow a mass storage device like a hard disk drive to enter a data protect mode. Often, logic within the computer system can execute a special interrupt service routine whose purpose is to shut down the disk drive in an orderly fashion thus preventing spurious writing to the disk in an unpredictable manner as the anomalous voltage condition deteriorates further. The design of such "power good" signal lines and their use with special disk drive interrupt service routines is known to those skilled in the art.

Not all host computers, however, provide a "power good" logic signal. Often when such a signal is provided, that "power good" signal is not a reliable indicator of voltage transients, particularly when the device to be protected from such transients is connected to the host computer by a long cable, which may be susceptible to electrical noise. In view of the foregoing, it will be appreciated that in the case of solid state memory cartridges, a voltage transient protection apparatus is desirable to protect the data within the cartridge memory.

Accordingly, one object of the present invention is to provide an voltage transient protection circuit which ensures that the solid state memory cartridge control lines are disengaged so as to prevent the possibility of writing spurious data to unpredictable memory locations in the solid state memory cartridge.

Another object of the present invention is to provide a voltage transient protection circuit which protects a memory cartridge from undesired writes during voltage transients and which operates reliably despite transients in the voltage supplied to power the voltage protection circuit.

In accordance with the present invention, a voltage transient protection apparatus is provided for protecting a memory device from an undesired control signal provided on a control signal path to the memory device. The apparatus includes an isolation circuit, situated in the control signal path, for isolating the memory device from the control signal in response to a first signal. The apparatus further includes a primary voltage port for coupling to a primary voltage source of primary voltage. A transient detecting circuit is included in the apparatus for providing the first signal to the isolation circuit when a voltage transient occurs in the primary voltage. The apparatus further includes a secondary voltage source for supplying voltage to the transient detecting circuit and to the isolation circuit for a period of time sufficiently long while said primary voltage is fluctuating during a transient to permit the isolation circuit to achieve isolation of the control signal from the memory device.

The features of the invention believed to be novel are specifically set forth in the appended claims. However, the invention itself, both as to its structure and method of operation, may best be understood by referring to the following description and accompanying drawings.

DETAILED DESCRIPTION OF THE INVENTION

Figure 1:
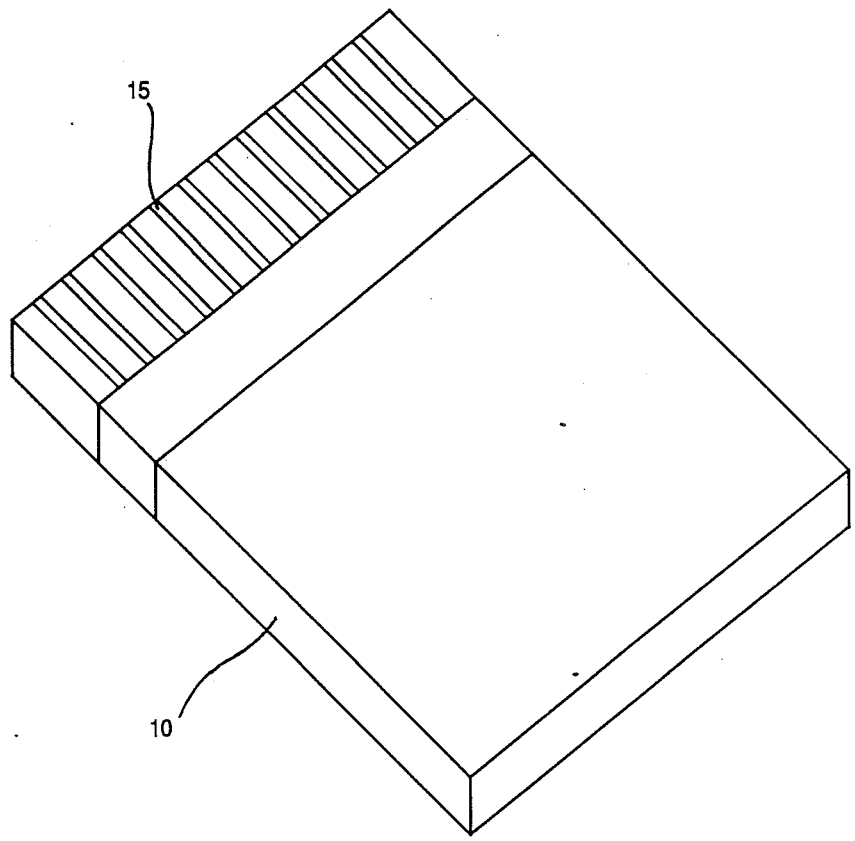
FIG. 1 is a left side perspective of a solid state memory cartridge.
Figure 2:
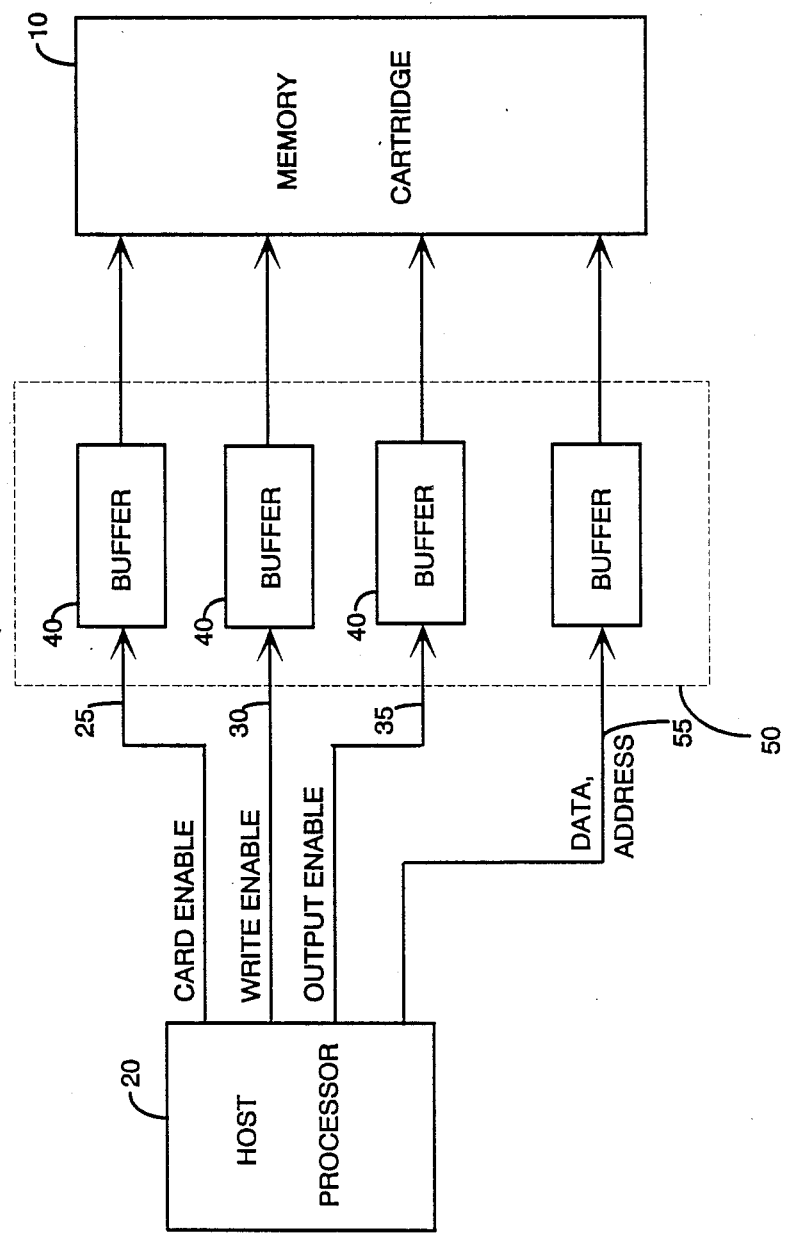
FIG. 2 a simplified block diagram of a conventional circuit arrangement for coupling a host computer processor to a solid state memory cartridge.
Figure 3:
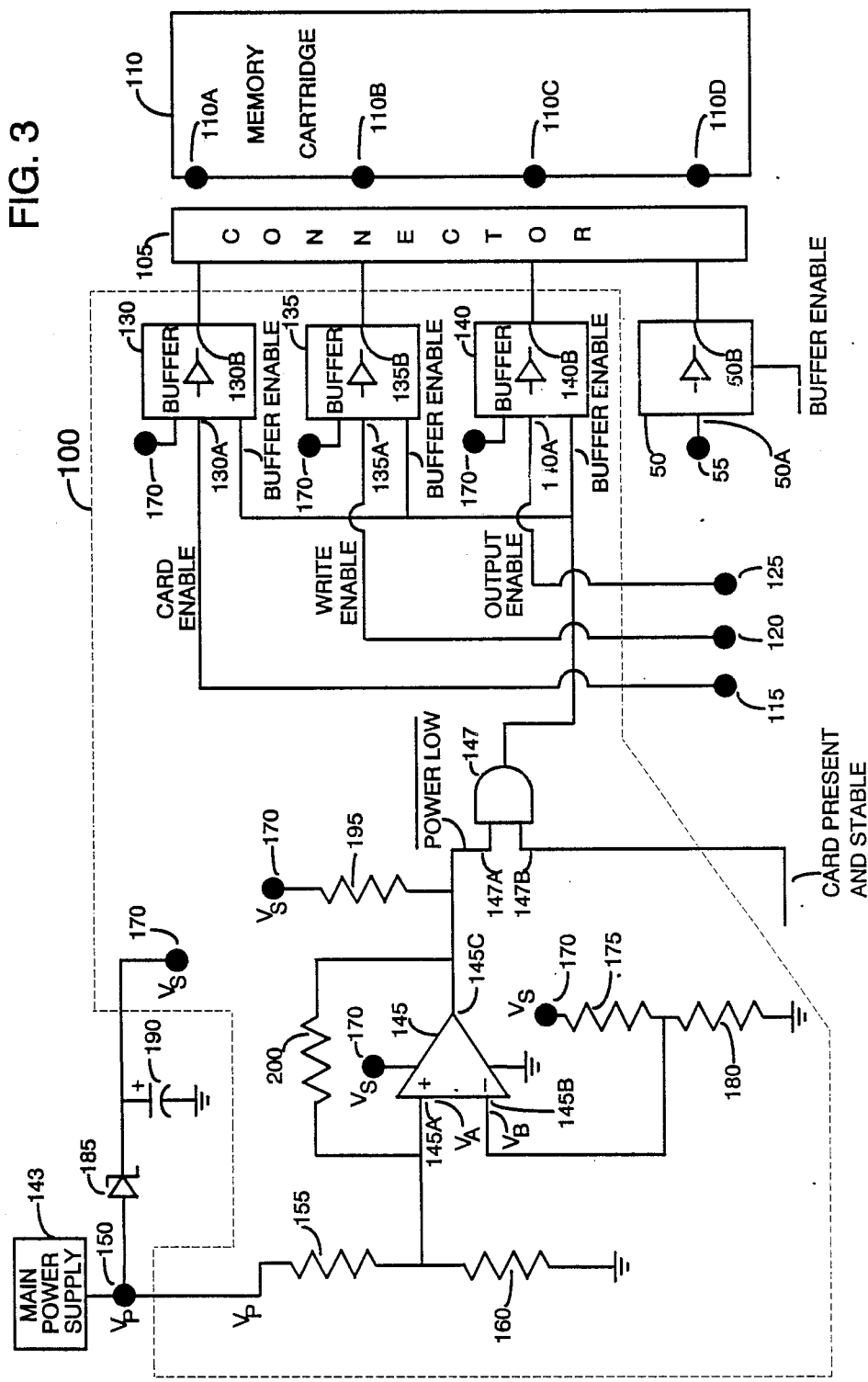
FIG. 3 is a schematic block diagram of a voltage transient protection apparatus of the present invention.

In accordance with one embodiment of the present invention, FIG. 3 shows a schematic block diagram of the voltage transient protection apparatus of the invention as apparatus 100. Apparatus 100 is implemented in positive true logic, although those skilled in the art will appreciate that equivalent logic such as negative true logic may also be used to implement apparatus 100. In FIG. 3, voltage transient protection apparatus 100 is shown coupled to a multi-pin connector 105 for receiving a solid state memory cartridge 110 therein. One solid state memory cartridge which may be employed as memory cartridge 110 is the Model RBC008IE00 memory cartridge manufactured by Epson Corporation. Although this particular cartridge has a memory storage capacity of 8K bytes, those skilled in the art will appreciate that the voltage transient protection apparatus of the invention may be used in conjunction with memory cartridges having other storage capacities as well.

While the above described memory cartridge is of the contact type, non-contact types of memory cartridges may also be employed as cartridge 110. For example, non-contact memory cartridges of the "coil to coil" type such as the Model R-32KB LSI card available from Nippon LSI Card Co., LTD may be used as cartridge 110.

Memory cartridge 110 includes a CARD ENABLE port 110A, a WRITE ENABLE port 110B and an OUTPUT ENABLE port 110C to which buffered CARD ENABLE, buffered WRITE ENABLE and buffered OUTPUT ENABLE control signals are provided, respectively, via connector 105 as described subsequently. The CARD ENABLE port is alternatively referred to as the main select port or as the chip enable port. Memory cartridge 110 also includes a data and address bus port 110D to which appropriate data and address signals are provided via data and address buffer 50 and connector 105. That is, data/address buffer 50 includes an input 50A to which data and address signals are provided and further includes an output 50B which is coupled to data/address cartridge port 110D via connector 105. Data/address input 50A is shown coupled to a data/address bus 55.

Control signals, namely CARD ENABLE signals, WRITE ENABLE signals and OUTPUT ENABLE signals suitable for cartridge 110 are generated in the conventional manner and are provided to CARD ENABLE input 115, WRITE ENABLE input 120 and OUTPUT ENABLE input 125, respectively. In this embodiment of the invention, apparatus 100 includes a CARD ENABLE buffer 130 coupled between CARD ENABLE signal input 115 and cartridge CARD ENABLE port 110A, a WRITE ENABLE signal buffer 135 coupled between WRITE ENABLE signal input 120 and cartridge WRITE ENABLE port 110B and an OUTPUT ENABLE signal buffer 140 coupled between OUTPUT ENABLE input 125 and cartridge OUTPUT ENABLE port 110C. Tri-state buffers, which when disabled are capable of effectively isolating the corresponding inputs and outputs thereof are used as buffers 130, 135 and 140.

In more detail, buffers 130, 135 and 140 include inputs 130A, 135A and 140A, respectively, and further include outputs 130B, 135B and 140B, respectively, as shown in FIG. 3. Thus, when memory cartridge 110 is inserted into connector 105, buffer output 130B is coupled to cartridge CARD ENABLE port 110A, WRITE ENABLE output 135B is coupled to cartridge WRITE ENABLE port 110B and buffer output 140B is coupled to cartridge OUTPUT ENABLE port 110C. It will be appreciated that buffer outputs 130B, 135B and 140B are single-conductor lines and that memory cartridge ports 110A, 110B and 110C are correspondingly single-conductor ports. Buffer output 50B, however, is a multi-conductor port and memory cartridge port 110D is correspondingly a multi-conductor port.

Each of buffers 130, 135 and 140 includes an enable input designated BUFFER ENABLE which when set to a logical high state (1) causes the signals at inputs 130A, 135A and 140A to pass through to the output of the respective buffers. However, when the BUFFER ENABLE inputs of buffers 130, 135 and 140 are set to a logical low state (0), then the respective buffers 130, 135 and 140 are placed in a high impedance state which prevents the signals at the inputs of the buffers from passing through to the outputs of the buffers. The signal which is supplied to the BUFFER ENABLE inputs of buffers 130, 135 and 140 is referred to subsequently as the BUFFER ENABLE signal. From the above, it will be appreciated that depending on whether the BUFFER ENABLE signal is set to 1 or 0 will determine if the CARD ENABLE, WRITE ENABLE and OUTPUT ENABLE signals are provided to the respective ports on memory cartridge 110 or if the CARD ENABLE, WRITE ENABLE and OUTPUT ENABLE signals are prevented from reaching cartridge 110.

Apparatus 100 includes a comparator 145 having inputs 145A and 145B. Comparator 145 further includes an output 145C which is coupled to the BUFFER ENABLE inputs of buffers 130, 135 and 140 via an AND gate 147. That is, the BUFFER ENABLE signal is generated at the output of AND gate 147. AND gate 147 includes two inputs 147A and 147B of which AND gate input 147A is coupled to comparator output 145C at which a /POWER LOW signal is generated. The remaining AND gate input 147B is supplied a CARD PRESENT AND STABLE signal generated by the host processor.

Through the action of AND gate 147, buffers 130, 135 and 140 are activated only when both cartridge 10 has been inserted and after power thereto has stabilized as indicated by the "CARD PRESENT AND STABLE" signal. That is, buffers 130, 135 and 140 are enabled when the low power condition signal "/POWER LOW" is in the active high state and the CARD PRESENT AND STABLE signal is in the active high state, which thus causes the BUFFER ENABLE signal at the output of AND gate 147 to go high.

It is again noted that when the BUFFER ENABLE signal is high, buffers 130, 135 and 140 are enabled to permit the passage of information from the inputs thereof to the outputs thereof.

A main power supply 143 is shown in FIG. 3 as including an output at which a DC voltage $V_P$ is generated. Source voltage $V_P$ is generally employed as the main voltage source for a drive unit for memory cartridge 110 and the computer or other processor in which memory cartridge 110 is used. Main voltage source voltage $V_P$ is supplied to a main voltage source terminal 150. As explained earlier, but for the voltage transient protection capabilities of the present invention, it may be possible for one or more of buffers 130, 135 and 140 to undesirably remain enabled when a voltage transient or fluctuation occurs on main supply voltage terminal 150. If this were permitted to occur, it would be possible for memory cartridge 110 to become undesirably WRITE ENABLE'd such that random data could be written to unpredictable memory locations within memory cartridge 110. Such random data would likely violate the integrity of data stored on memory cartridge 110 and could render that data useless. To avoid this unfortunate circumstance, apparatus 100 provides for the disabling of the CARD ENABLE, WRITE ENABLE and OUTPUT ENABLE signal paths to memory cartridge 110 in the event that a voltage transient is sensed by apparatus 100 on main supply voltage terminal 150 in the manner now explained.

Comparator 145 compares a sample $V_A$ of the main supply voltage $V_P$ on comparator input 145A with a sample $V_B$ of a secondary supply voltage $V_S$ on comparator input 145B and generates an /POWER LOW output signal on comparator output 145C. The comparator 145C /POWER LOW output signal is related to the difference between the input signals $V_A$ and $V_B$ supplied to inputs 145A and 145B. In this embodiment of the invention comparator 145 is a difference amplifier having a non-inverting input 145A and an inverting input 145B. That is, a positive going signal on input 145A drives output 145C in a positive direction and a negative going signal on input 145B drives output 145C in a negative direction providing the aforementioned difference output signal (/POWER LOW) on output 145C of comparator 145.

In more detail, main supply voltage $V_P$ is applied to main supply voltage terminal 150 and further is coupled via a resistor voltage divider network including resistor 155 and resistor 160 to comparator input 145A as voltage $V_A$. In a similar manner, secondary supply voltage $V_S$ is applied to secondary voltage terminals 170. In particular, the secondary supply voltage $V_S$ at terminal 170, generated in a manner discussed later, is coupled via a resistor voltage divider network including resistor 175 and resistor 180 to comparator input 145B as voltage $V_B$. Secondary voltage terminal 170 also provides the operating voltage potential for buffers 130, 135, 140 and for comparator 145 as shown in FIG. 3.

In this embodiment of the invention, the primary voltage $V_P$ supplied to primary voltage terminal 150 is approximately 4.6 volts in the absence of a voltage transient or voltage anomaly on voltage terminal 150. Resistors 155 and 160 form a voltage divider network which divides the primary supply voltage $V_P$ down to a voltage sample $V_A$ of approximately 3.5 volts and couples that divided voltage sample $V_A$ to non-inverting comparator input 145A.

The secondary voltage $V_S$ supplied to secondary voltage terminal 170 is also approximately 4.6 volts. Resistors 175 and 180 form a voltage divider network which divides the secondary supply voltage $V_S$ down to a second voltage sample $V_B$ of approximately 3.5 volts and couples this second voltage sample $V_B$ to inverting comparator input 145B. The difference between the voltage samples $V_A$ and $V_B$ supplied to inputs 145A and 145B of comparator 145 is such that the voltage $V_A$ exceeds the voltage $V_B$, causing its output to be a logic "1". The comparator 145 shown in FIG. 3 is of the open collector type which requires a pull up resistor 195. It will be recognized by those skilled in the art that comparators with other types of outputs may also be used as comparator 145.

It will also be appreciated by those skilled in the art that a supply voltage other than 4.6 volts can be supplied to primary supply voltage terminal 150 and also that a supply voltage other than 4.6 volts can be supplied to secondary voltage terminal 170. It will be further recognized and appreciated by those skilled in the art that voltage potentials other than 3.5 volts can be supplied to inputs 145A and 145B of comparator 145 consistent with the present invention. The voltage $V_A$, supplied to comparator input 145A is determined by the values of resistors 155 and 160 forming the resistor divider network supplying an input signal to input 145A of comparator 145 as well as by the value of the primary voltage $V_P$ supplied to the resistor network at terminal 150. The voltage $V_B$ supplied to comparator input 145B is determined by the values of resistors 175 and 180 forming the resistor divider network supplying an input signal to input 145B of comparator 145 as well as by the value of the secondary voltage $V_S$ which is supplied 145A of comparator 145 as well as by the value of the voltage supplied to the resistor network at terminal 170.

As long as voltages within the cartridge's operating tolerance are supplied to primary voltage terminal 150 and to secondary voltage terminal 170, the aforementioned logic "1" appears at output 145C of comparator 145. Thus, the /POWER LOW signal at output 145C exhibits a logic high under these conditions. Assuming that both the /POWER LOW signal and the CARD PRESENT AND STABLE signal provided to the inputs of AND gate 147 are active high, then the BUFFER ENABLE signal provided to buffers 130, 135, and 140 is also high. When the BUFFER ENABLE signal is set to a logical high state (1), then the signals at buffer inputs 130A, 135A and 140A pass through to the outputs of the respective buffers.

In this embodiment of the invention the secondary voltage $V_S$ supplied to secondary voltage terminals 170 is derived from the primary voltage $V_P$ supplied to primary voltage terminal 150 by an isolation diode 185 which couples primary voltage terminal 150 to secondary voltage terminal 170. It will be appreciated that other alternative voltage sources could be used for secondary voltage source $V_S$ on secondary voltage terminal 170 in other embodiments of the invention. In this embodiment of the present invention, however, a capacitor 190 is coupled between secondary voltage terminal 170 and ground potential. That is, the application of primary voltage $V_P$ to primary voltage terminal 150 through isolation diode 185 causes capacitor 190 to charge up to a secondary voltage potential $V_S$ on secondary voltage terminal 170. The secondary voltage potential $V_S$ on secondary voltage terminal 170 is thereby substantially equal to the primary voltage potential $V_P$ on primary voltage terminal 150 as long as a steady primary voltage is supplied to primary voltage terminal 150. Capacitor 190 serves as a charge storage device which can supply operating potential for all circuits connected to terminal 170 in the event that primary voltage $V_P$ supplied to terminal 150 is suddenly reduced due to a voltage transient. That is, for a predetermined period of time, capacitor 190 serves as a secondary power source supplying terminals 170 in the event of an under-voltage transient condition on primary voltage terminal 150.

As was stated earlier, buffers 130, 135, 140 and comparator 145 operate from secondary voltage $V_S$ supplied by secondary voltage terminal 170. In the event that the primary voltage $V_P$ supplied to primary voltage terminal 150 decreases in voltage potential, isolation diode 185 becomes back biased and therefore presents a high impedance between secondary voltage terminal 170 and primary voltage terminal 150. Thus, isolation diode 185 prevents capacitor 190 from being discharged into primary voltage port 150. Capacitor 190 continues to supply secondary operating voltage to buffers 130, 135, 140 and comparator 145 for a predetermined period of time sufficiently long to permit an appropriate BUFFER ENABLE signal (0) to be supplied to buffers 130, 135 and 140 to place such buffers in a high impedance state to prevent the transfer of undesired CARD ENABLE, WRITE ENABLE or OUTPUT ENABLE signal to memory cartridge 110. Once buffers 130, 135 and 140 have been placed in such an isolation state, the continued collapse of the primary voltage $V_P$ does not matter. That is, during the critical period of a negative going transient when primary voltage $V_P$ is collapsing, secondary voltage $V_S$ maintains voltage to comparator 145 and buffers 130, 135 and 140 to permit the orderly transition of these buffers to a high impedance or isolation state.

Initially, at the beginning of the undervoltage transient, the voltage signal $V_B$ on inverting input 145B of comparator 145 continues to be substantially 3.5 volts as described earlier. However, as the transient progresses in time, the voltage signal $V_A$ supplied to non-inverting input 145A of comparator 145 decreases below the nominally 3.5 volts in proportion to the decrease in the primary voltage supplied to terminal 150, the proportion being set by the resistor divider network of resistors 155 and 160. Since the voltage potential on the inverting input 145B now exceeds the voltage potential on the non-inverting input 145A, the /POWER LOW output output 145C of comparator 145 assumes as logic low state (0) and therefore the BUFFER ENABLE inputs of buffers 130, 135 and 140 likewise assume a logic low state (0).

As was discussed earlier, when the BUFFER ENABLE inputs of buffers 130, 135 and 140 are set to a logical low state (0), then the respective buffers 130, 135 and 140 are placed in a high impedance state which prevents the signals at the inputs of buffers 103, 135 and 140 from passing through to the outputs of the respective buffers. Memory cartridge 100 is thereby isolated from the CARD ENABLE, WRITE ENABLE and OUTPUT ENABLE signals which may be supplied to the inputs of buffers 130, 135, and 140 respectively.

As is well know to those skilled in the art, the host computer generates the control, data and address signals that are typically input to memory cartridge 110. In accordance with the invention voltage transient on main supply voltage terminal 150 represented by the decrease in the main supply voltage has results in the shut down of memory cartridge 110. That is, memory cartridge 110 is thereby shut down before the main supply voltage deteriorates to a voltage low enough to cause spurious signals to appear on control lines and address and data lines to memory card 110 and possibly cause damage to cartridge 110 or to the data therein.

Further deterioration of the main supply voltage may cause the host computer in which circuit 100 is used to power down. The host computer may resume further operation following a normal power up sequence. Voltages, in particular the main supply voltage appearing on main supply terminal 150, are thereby restored in a normal power up sequence.

A hysteresis resistor 200 may be coupled between output 145C and non-inverting input 145A of comparator 145. This resistor 200 prevents oscillation of the power low signal, /POWER LOW, during the time interval during the decay of voltage $V_A$ when voltage $V_A$ is approximately equal to $V_B$.

The foregoing describes an apparatus for disconnecting CARD ENABLE, WRITE ENABLE, and OUTPUT ENABLE signals from a solid state memory cartridge by disabling the respective control signal buffers when a voltage transient is sensed on a main voltage source. The voltage sensing circuit and the buffers are powered by a secondary voltage source which is isolated from under-voltage or negative going transients on the main voltage line. When the main voltage decreases to a predetermined value in such a negative going transient, the transient protection circuit of apparatus 100 disables buffers 130, 135 and 140 and prevents CARD ENABLE, WRITE ENABLE and OUTPUT ENABLE signals from reaching memory cartridge 110. Data on memory cartridge 110 is thereby protected from unpredictable and spurious data inputs which may occur during the voltage transient condition.

Those skilled in the art will appreciate that although an under-voltage or negative going transient protection apparatus 100 has been described for purposes of example, a similar over-voltage or positive going (spike) transient protection apparatus is readily implemented. A desirable feature of that embodiment would be to additionally interrupt the power supply to the memory cartridge if the supply voltage exceeded a specified maximum voltage for the cartridge.

Although three control signals, namely, CARD ENABLE, WRITE ENABLE and OUTPUT ENABLE are shown as being interdicted by the voltage transient protection apparatus 100, those skilled in the art will appreciate that a lesser number or a larger number of such control signals could be so interdicted.

Voltage transient protection apparatus 100 may be physically located at either end of a cable coupling the host computer with a memory cartridge receiving apparatus or drive which houses memory cartridge 110. That is, voltage protection apparatus 100 may be located close to a drive which may be at the end of a long cable coupling the drive to a host computer. Voltage transient protection apparatus 100 may also be physically located within the host computer, as for example on a controller card for controlling the drive which houses memory cartridge 110, at the host computer end of the cable connecting the host computer with the drive. In another embodiment of the invention, a voltage transient protection apparatus 100 is located redundantly at each end of the cable connecting the host computer with the drive housing memory cartridge 110.

While only certain preferred features of the invention have been shown by way of illustration, many modifications and changes will occur to those skilled in the art. For example, analog switches may be employed in place of buffers 130, 135 and 140. It is, therefore, to be understood that the present claims are intended to cover all such modifications and changes which fall within the true spirit of the invention.

I claim:

1. A voltage transient protection apparatus for protecting a memory device from a plurality of different undesired control signals provided respectively on a plurality of different control signal paths to said memory device, said apparatus comprising:

a plurality of isolation means for isolating said memory device from said control signals in response to a first signal, each of said plurality of isolation means being situated in a different one of said plurality of control signal paths;

a primary voltage port for coupling to a primary voltage source of primary voltage;

transient detecting means for providing said first signal to said plurality of isolation means when a voltage transient occurs in said primary voltage and, a capacitive secondary voltage source for supplying voltage to said transient detecting means and to said plurality of isolation means for a period of time sufficiently long while said primary voltage is fluctuating during a transient to permit said plurality of isolation means to achieve isolation of said control signals from said memory device, said transient detecting means being coupled to said primary voltage port to sense the primary voltage thereof and being further coupled to said secondary voltage source to receive voltage therefrom to power said transient detecting means.

2. The voltage transient apparatus of claim 1 including discharge prevention means, coupled between said secondary voltage source and said primary voltage port, to permit said secondary voltage source to receive voltage from said primary voltage port while preventing said secondary voltage source from being discharged through said primary voltage port.

3. A voltage transient protection apparatus for protecting a memory device from a plurality of different undesired control signals provided on a plurality of respective control signal paths to said memory device, said apparatus comprising:

a plurality of tri-state buffers respectively situated in said plurality of control signal paths, each of said tri-state buffers being capable of exhibiting an isolative tri-state mode in response to a first signal, said plurality of tri-state buffers otherwise exhibiting a connective mode;

a primary voltage port for coupling said protection apparatus and said memory device to a primary voltage source of primary voltage;

transient detecting means for providing said first signal to said plurality of tri-state buffers when a voltage transient occurs in said primary voltage;

a capacitive secondary voltage source for supplying voltage to said tri-state buffers and said transient detecting means for a period of time sufficiently long while said primary voltage is fluctuating during a transient to permit said plurality of tri-state buffers to enter said isolative tri-state mode to achieve isolation of said plurality of control signals from said memory device.

4. A voltage transient protection apparatus for protecting a memory device from a plurality of different undesired control signals provided on a plurality of respective control signal paths to said memory device, said apparatus being responsive to a MEMORY DEVICE PRESENT AND STABLE signal which indicates when said memory device is present and stable, said apparatus comprising:

a plurality of tri-state buffers situated in said plurality of control signal paths, respectively, each of said tri-state buffers being capable of exhibiting a connective mode in response to a first signal exhibiting a first logic state and an isolative tri-state mode in response to said first signal exhibiting a second logic state;

a primary voltage port for coupling said protection apparatus and said memory device to a primary voltage source of primary voltage;

transient detecting means for providing a POWER LOW signal to indicate when a negative-going voltage transient occurs in said primary voltage, such transient exhibiting an amplitude less than a predetermined threshold level;

logic circuit means, coupled to said plurality of tri-state buffers, for AND'ing said POWER LOW signal with said MEMORY DEVICE PRESENT AND STABLE signal to generate said first signal exhibiting said first logic state to cause said plurality of tri-state buffers to exhibit said connective mode when said POWER LOW signal indicates that a negative going transient in said primary voltage is not presently occurring and said MEMORY DEVICE PRESENT AND STABLE signal indicates that said memory device is present and stable, said logic circuit means otherwise generating said first logic signal exhibiting said second logic state to cause said plurality of tri-state buffers to exhibit said isolative tri-state mode, and a capacitive secondary voltage source for supplying voltage to said transient detecting means, to said logic circuit means, and to said plurality of tri-state buffers, for a period of time sufficiently long while said primary voltage source is collapsing during a negative going transient in said primary voltage to permit said tri-state buffers to enter said isolative tri-state mode to achieve isolation of said plurality of control signals from said memory device.

* * * * *